US007192997B2

(12) United States Patent
Papathomas

(10) Patent No.: US 7,192,997 B2
(45) Date of Patent: Mar. 20, 2007

(54) ENCAPSULANT COMPOSITION AND ELECTRONIC PACKAGE UTILIZING SAME

(75) Inventor: Konstantinos I. Papathomas, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 556 days.

(21) Appl. No.: 09/778,996

(22) Filed: Feb. 7, 2001

(65) Prior Publication Data

US 2002/0105093 A1 Aug. 8, 2002

(51) Int. Cl.
- C08K 3/10 (2006.01)
- C08L 63/00 (2006.01)
- C08L 71/12 (2006.01)
- C08L 87/00 (2006.01)
- H01L 23/29 (2006.01)

(52) U.S. Cl. ............ 523/442; 257/793; 523/443; 524/544; 524/560; 524/567; 524/571; 524/574; 524/575; 524/577; 524/578; 524/579; 524/588; 524/590; 524/601; 524/606; 524/609; 524/611; 524/612; 525/390; 525/396; 525/507; 525/524

(58) Field of Classification Search ........... 428/413, 428/415, 414, 901, 423.1; 361/771; 257/789, 257/794, 795; 523/466, 400; 524/589, 871
See application file for complete search history.

(56) References Cited

U.S. PATENT DOCUMENTS

| 2,890,194 A | 6/1959 | McGary, Jr. et al. ...... 260/45.4 |
| 2,890,197 A | 6/1959 | McGary, Jr. et al. ...... 260/45.4 |
| 3,207,357 A | 9/1965 | Schmitt ........................ 220/62 |
| 3,401,126 A | 9/1968 | Miller et al. ................. 252/514 |
| 3,429,040 A | 2/1969 | Miller ........................ 29/626 |
| 3,553,244 A | 1/1971 | Grigat et al. ............... 260/453 |
| 3,681,292 A | 8/1972 | Loudas et al. .............. 260/77.5 |
| 3,740,348 A | 6/1973 | Grigat et al. ............... 260/453 |
| 3,755,402 A | 8/1973 | Grigat et al. ............... 260/453 |
| 4,195,132 A | 3/1980 | Sundermann et al. ....... 521/155 |
| 4,294,746 A | 10/1981 | Blair et al. .................... 260/37 |
| 4,477,629 A | 10/1984 | Hefner, Jr. ................... 525/113 |
| 4,546,131 A | 10/1985 | Hefner, Jr. ................... 523/466 |
| 4,604,644 A | 8/1986 | Beckham et al. ............ 375/80 |
| 4,740,584 A | 4/1988 | Shimp ......................... 528/422 |
| 4,745,215 A | 5/1988 | Cox et al. .................... 560/301 |
| 4,999,699 A | 3/1991 | Christie et al. ............... 375/65 |
| 5,089,440 A | 2/1992 | Christie et al. ............... 437/209 |
| 5,194,930 A * | 3/1993 | Papathomas et al. ........ 257/773 |
| 5,225,484 A * | 7/1993 | Shiobara et al. ............. 525/101 |
| 5,250,600 A * | 10/1993 | Nguyen et al. .............. 524/377 |
| 5,250,848 A | 10/1993 | Christie et al. .............. 257/778 |
| 5,668,059 A | 9/1997 | Christie et al. .............. 438/118 |
| 5,668,904 A | 9/1997 | Sutherland et al. ........... 385/72 |
| 5,698,904 A | 12/1997 | Tsuji ........................... 257/795 |
| 5,766,670 A * | 6/1998 | Arldt et al. ..................... 427/8 |
| 5,981,313 A | 11/1999 | Tanaka ........................ 438/118 |
| 5,982,631 A | 11/1999 | Bowles et al. ............... 361/771 |
| 6,057,402 A * | 5/2000 | Zhou et al. .................. 525/122 |
| 6,090,474 A * | 7/2000 | Johansson et al. ........... 428/209 |
| 6,121,358 A * | 9/2000 | Dershem et al. ............. 524/439 |
| 6,376,100 B1 * | 4/2002 | Shiobara et al. ............. 428/620 |
| 6,444,407 B1 * | 9/2002 | Day et al. .................... 430/321 |
| 6,790,473 B2 * | 9/2004 | Papathomas et al. ........ 427/504 |
| 6,794,040 B2 * | 9/2004 | Johansson et al. ........... 428/413 |

FOREIGN PATENT DOCUMENTS

| DE | 2611796 | 10/1976 |
| DE | 4223632 | 1/1994 |
| EP | 0147548/82 | 10/1984 |
| EP | 0650504 | 5/1995 |
| JP | 07-268278 A * | 10/1995 |
| JP | 09-40747 A * | 2/1997 |
| JP | 09-59349 A * | 3/1997 |
| JP | 2000-248158 A * | 9/2000 |

OTHER PUBLICATIONS

Epoxide Resins, Potter, W.G., Butterworth & Co., 1970, p. 135.*
Chemical abstracts registry No. 9002-93-1 for Triton X-100 or polyethylene glycol p-tert-octylphenyl ether, 1967.*
CAPLUS accession No. 1997:713725 for the Materials Research Society Symposium Proceedings article by Shi et al. entitled "Composite materials with adjustable thermal expansion for electronic applications," vol. 445, abstract.*
Chemical abstracts registry No. 9002-93-1 for Triton X-100, polyethylene glycol-p-tert-octylphenyl ether, 2006.*
IBM Technical Disclosure Bulletin, vol. 13, No. 4, Sep. 1970, "Coating Material", E.C. Spaulding and L.A. Manrique, Jr., p. 825.
"Plastic Materials", 1996, J. Brydson, p. 471.
"Engineering Plastics", D.C. Clagett, Encyclopedia of Polymer Science and Engineering, John Wiley and Sons, Final Edition, (title pg., copyright pg., and Table of Contents pg.).
"Cycloaliphatic Epoxy Systems", Union Carbide Corporation, 1970.

* cited by examiner

Primary Examiner—Robert Sellers
(74) Attorney, Agent, or Firm—Schmeiser, Olson & Watts; William H. Steinberg

(57) ABSTRACT

A composition for use in making an encapsulant usable in the encapsulation of a semiconductor chip assembled to a substrate with C4 solder interconnections therebetween, which in turn may form part of an electronic package. The composition comprises a resin, a flexibilizing agent and a filler material.

27 Claims, 1 Drawing Sheet

ENCAPSULANT COMPOSITION AND ELECTRONIC PACKAGE UTILIZING SAME

TECHNICAL FIELD

This invention relates to a composition such as may be used for encapsulating a semiconductor chip on a substrate as part of an electronic package.

BACKGROUND OF THE INVENTION

Controlled collapse chip connection (C4) or flip-chip technology has been successfully used for over twenty years for interconnecting high I/O (input/output) count and area array solder bumps on silicon chips to base ceramic chip carriers, for example alumina carriers. The solder bump, typically a lead/tin (Pb/Sn) alloy such as 95 Pb/5 Sn alloy provides the means of chip attachment to the ceramic chip carrier for subsequent usage and testing. This is described in U.S. Pat. Nos. 3,401,126 and 3,429,040 to Miller and assigned to the assignee of the present application. Typically, malleable pads of metallic solder are formed on semiconductor chip contact sites and solder joinable sites are formed on conductors on the chip carrier. The chip carrier solder joinable sites are surrounded by non-solderable barriers so that when the solder on the semiconductor chip contact sites melts, to form a joint, surface tension of the molten solder prevents collapse of the joints and thus holds the semiconductor chip suspended above the chip carrier.

Usually the circuit semiconductor chips are mounted on supporting substrates made of materials with coefficients of thermal expansion that differ from the coefficient of thermal expansion of the material of the semiconductor chip, i.e. silicon. Normally the semiconductor chips are formed of monocrystalline silicon with a coefficient of thermal expansion of about 2.5 parts per million (ppm.)/degree Celsius (° C.) and the substrate is formed of a ceramic material, typically alumina with a coefficient of thermal expansion of about 5.8 ppm./° C. In operation, the active and passive elements of each integrated semiconductor chip inevitably generate heat resulting in temperature fluctuations in both the chips and the supporting substrate since the heat is conducted through the solder joints. The chips and the substrate thus expand and contract in different amounts with temperature fluctuations, due to the different coefficients of thermal expansion. This imposes stresses on the relatively rigid semiconductor chip solder joints.

The stress on the semiconductor chip solder joints during operation is directly proportional to (1) the magnitude of the temperature fluctuations, (2) the distance of an individual joint from the neutral or central point (DNP), and (3) the difference in the coefficients of thermal expansion of the material of the semiconductor chip and the substrate, and inversely proportional to the height of the solder joint, that is the spacing between the chip and the support substrate. The seriousness of the situation is further compounded by the fact that as the solder joints become smaller in diameter in order to accommodate the need for greater I/O density, the overall height decreases. U.S. Pat. No. 4,604,644 to Beckham, et al. and assigned to the assignee of the present application, describes a structure for electrically joining a semiconductor chip to a support substrate that has a plurality of solder connections where each solder connection is joined to a solder wettable pad on the chip and a corresponding solder wettable pad on the support substrate. Dielectric organic material is disposed between the peripheral area of the chip and the facing area of the substrate, the material surrounds at least one outer row and column of solder connections but leaves the solder connections in the central area of the device free of dielectric organic material. The preferred material disclosed in U.S. Pat. No. 4,604,644 is obtained from a polyimide resin available commercially and sold under the product name AI-10 by BP-Amoco Chemical Corporation, Chicago, Ill. AI-10 is formed by reacting a diamine such as p,p'diaminodiphenylmethane with trimellitic anhydride or acylchloride of trimellitic anhydride. The polymer is further reacted with gamma.-amino propyl triethoxy silane or β-(3,4-epoxy cyclohexyl) ethyltrimethoxy silane. The coating material is described in IBM TDB September 1970 P. 825.

More recently, U.S. Pat. No. 5,668,904, and assigned to the assignee of the present application, describes a method of increasing the fatigue life of solder interconnections between a semiconductor chip and a supporting substrate. The method includes attaching the semiconductor chip to the substrate by a plurality of solder connections that extend from the supporting substrate to electrodes on the semiconductor chip to form a gap between the supporting substrate and the semiconductor chip. The gap is filled with a composition consisting of a cycloaliphatic polyepoxide and/or cyanate ester or prepolymers, and fillers such as aluminum nitride or aluminum oxide. The composition is then cured.

Although the above techniques have been quite successful in improving fatigue life of solder interconnections between a semiconductor chip and a supporting substrate, there still remains room for improvement in extending the fatigue life. An improved encapsulant composition for making an encapsulant has been developed to further improve fatigue life of solder interconnections between a semiconductor chip and a supporting substrate. It is believed that such a composition and the resultant electronic package will constitute a significant advancement in the art.

OBJECTS AND SUMMARY OF THE INVENTION

Accordingly, it is the object of this invention to provide a new and unique composition which in turn may be used as an encapsulant in an electronic package.

Another object of this invention is to provide a method of making such an encapsulant composition.

Yet another object of this invention is to provide an electronic package including a substrate, a semiconductor chip positioned on the substrate, and an encapsulant composition positioned on the substrate and on a portion of the semiconductor chip, the composition having a resin material, a flexibilizing agent, and a filler as part thereof. The encapsulant composition will improve the fatigue life of solder interconnections between the semiconductor chip and the substrate.

The invention is adaptable to mass production and improves the operational field life of product made with the invention.

According to one aspect of the invention, there is provided an encapsulant composition comprising a resin material, a flexibilizing agent, and a filler material.

According to another aspect of the invention, there is provided a method of making an encapsulant composition, the method comprising the steps of providing a first quantity of resin material, adding to the first quantity of resin material a second quantity of flexibilizing agent, adding to the first quantity of resin material a third quantity of filler material, and blending the resin material.

According to yet another aspect of the invention, there is provided an electronic package comprising a substrate having an upper surface, a semiconductor chip mounted on a portion of the upper surface of the substrate and electrically coupled to the substrate, the semiconductor chip having a bottom surface and at least one edge surface being substantially perpendicular to the bottom surface, and a material positioned on at least the portion of the upper surface of the substrate and against at least a portion of the at least one edge surface of the semiconductor chip, the material having an encapsulant composition which includes a resin material, a flexiblizing agent, and a filler material.

BEST MODE FOR CARRYING OUT THE INVENTION

Figure 1:
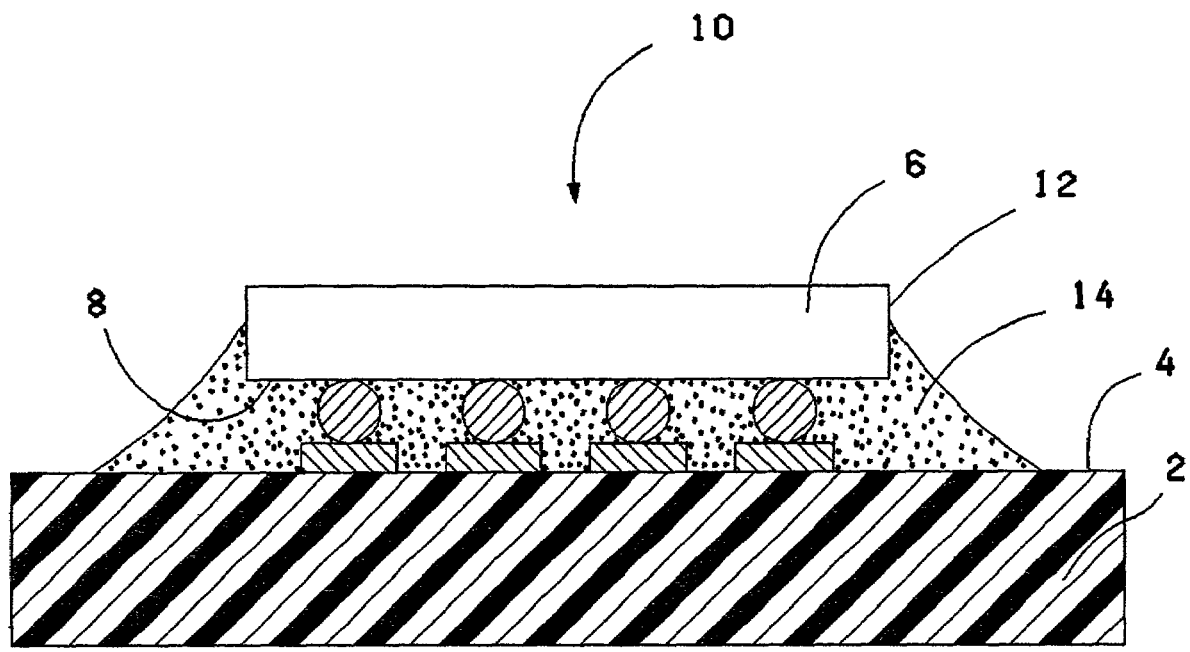
FIG. 1 is a sectional view in elevation of one embodiment of the electronic package of the present invention, illustrating the substrate having an upper surface, the semiconductor chip mounted on a portion of the upper surface of the substrate and electrically coupled to the substrate.

In accordance with the teachings of this invention, there is provided a new composition for use as an encapsulant in the manufacture of a chip carrier usable as part of an electronic package. In one embodiment, this encapsulant composition comprises a resin material, a flexibilizing agent, and a filler material. It has been discovered that when this composition is utilized in the assembly of a semiconductor chip onto a carrier to make a chip carrier, it results in a chip carrier package having improved operational field life. Specifically, during accelerated thermal cycling from between about −65° C. to about 125° C. hair line cracks may form along the corners of encapsulated semiconductor chips or in a plane between the encapsulant and the chip passivation layer. Such cracks, once initated, can grow during thermal cycling and result in catastrophic failure of the solder interconnections between the semiconductor chip and carrier to which it is assembled, decreasing the operational field life of the electronic package. The current encapsulant composition provides improved operational field life by substantially preventing the formation of such cracks.

The resin material of this invention is selected from the group consisting of epoxy and cyanate ester resins. The resin material comprises about 20% to about 55% by weight of the composition. Examples of epoxies that can be used in this invention are selected from non-glycidyl ether epoxies containing more than one 1,2-epoxy group per molecule. These are generally prepared by epoxidizing unsaturated aromatic hydrocarbon compounds, such as cyclo-olefins, using hydrogen peroxide or peracids such as peracetic acid and perbenzoic acid. The organic peracids are generally prepared by reacting hydrogen peroxide with either carboxylic acids, acid chlorides, or ketones, to give the compound R—COOOH. These materials are well known, and reference may be made to Brydson, J., *Plastic Materials,* 1966, page 471, for their synthesis and description.

Such non-glycidyl ether cycloaliphatic epoxides are characterized by having a ring structure wherein the epoxide group may be part of the ring or attached to the ring structure. These epoxides may also contain ester linkages. The ester linkages are generally not near the epoxide group and are relatively inert to reactions.

Examples of useful non-glycidyl ether cycloaliphatic epoxides include 3,4-epoxycyclohexylmethyl-3,4-epoxycyclohexane carboxylate, vinylcyclohexane dioxide; 3,4-epoxy-6-methylcyclohexylmethyl-3,4-epoxycyclohexane carboxylate and dicyclopentadiene dioxide. A distinguishing feature of many of the cycloalipahtic epoxides is the location of the epoxy group(s) on a ring structure rather than on an aliphatic side chain. Generally, the cycoaliphatic epoxides particularly useful in this invention will have the formula:

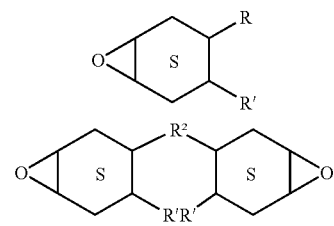

where S stands for a saturated ring structure, R is selected from the group consisting of $CHOCH_2$, $O(CH_2)_n CHOCH_2$, and $OC(CH_3)_2 CHOCH_2$ radicals, where n is 1 to 5. R' is selected from the group consisting of hydrogen, methyl, ethyl, propyl, butyl, and benzyl radicals and R" is selected from the group consisting of $CH_2OOC$ and $CH_2 OOC(CH_2)_4 COO$ radicals.

These cycloaliphatic epoxy resins may be characterized by reference to their epoxy equivalent weight, which is defined as the weight of epoxide in grams which contains one gram equivalent of epoxy. Suitable cycloaliphatic epoxy resins have a preferred epoxy equivalent weight of about 50 to about 250 grams per equivalent of epoxy. They will generally have a viscosity between about 5 to about 900 centapoise (cps) at 25° C.

Examples of cycloaliphatic epoxides are suggested in U.S. Pat. Nos. 3,207,357; 2,890,194; 2,890,197; and 4,294,746, the disclosures of which are hereby incorporated herein by reference. A discussion of various cycloaliphatic epoxides can be found in the publication entitled "Cycloaliphatic Epoxide Systems," Union Carbide Corporation, 1970, the disclosure of which is hereby incorporated herein by reference. Mixtures of cycloaliphatic epoxides can be employed when desired. Cycloaliphatic epoxies are usually low viscosity liquids at room temperature and can either be used alone or as reactive diluents in blends with the semi-solid glycidyl ether epoxies. These materials include 3',4'-epoxycyclohexylmethyl 3,4-epoxycyclohexanecarboxylate, which is available from Union Carbide Corporation, Danbury, Conn. under the product name ERL-4221 and available from Vantico Inc. 5121 San Fernando Road, Los Angeles, Calif., under the product name ARALDITE CY-179; diglycidylester of hexahydrophthalic anhydride available from Vantico Inc. under the product name CY-184; bis (3,4-epoxycyclohexylmethyl) adipate, available from Union Carbide Corporation under the product name ERL-4299; the isomeric mixture of bis (2,3-epoxycyclopentyl) ether, available from Union Carbide Corporation under the trademark name ERL-4205; ERL-4205 reacted with ethylene glycol or blended with a bisphenol A based diglycidyl ether, which were once available from Union Carbide Corporation under the product names ERLB-4617 and ERL-2258, respectively.

Other suitable epoxy resins which can be incorporated in the present invention include, for example, those represented by the following formulas, I–IV:

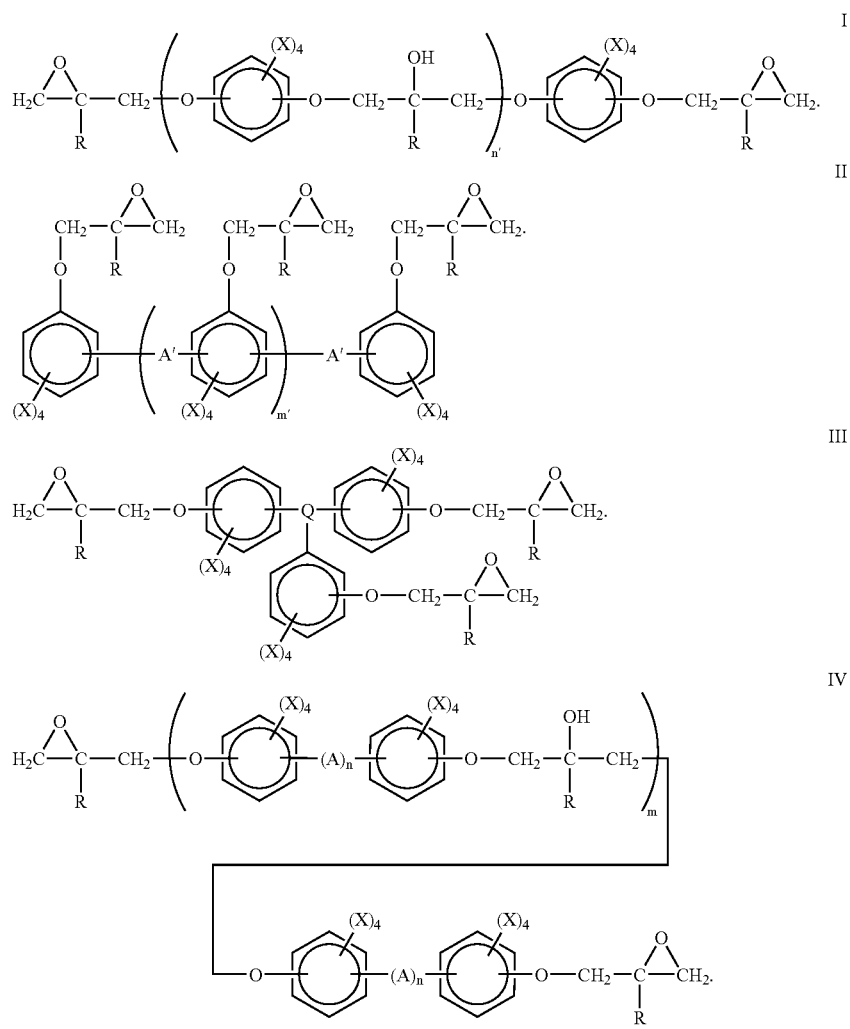

wherein each A is independently a divalent hydrocarbyl group having from 1 to about 9, and preferably from 1 to 4, carbon atoms, —O—, —SO$_2$—, or —CO—; each A' is independently a divalent hydrocarbyl group having from about 1 to about 9, and preferably from 1 to 4 carbon atoms; Q is a hydrocarbyl group having from about 1 to about 10 carbon atoms; Q' is hydrogen or an alkyl group having from about 1 to about 4 carbon atoms; each X is independently hydrogen, bromine, chlorine, or a hydrocarbyl group having from about 1 to about 9 and preferably from 1 to 4 carbon atoms; m has an average value of 0 to about 12, and preferably from 0.03 to 9, and most preferably from 0.03 to 3; m' has a value from about 0.011 to about 10, and preferably from 0.05 to 6; n has a value of 0 or 1; and n' has an average value from 0 to about 10, preferably from about 0.1 to about 3.

Suitable epoxy resins include, for example, the diglycidyl ethers of resorcinol, catechol, hydroquinone, biphenol, bisphenol A, tetrabromobisphenol A, phenolaldehyde novolac resins, alkyl substituted phenol-aldehyde resins, bisphenol F, tetramethylbiphenol, tetramethyltetrabromophenol, tetramethyltetrabromophenol, tetrachlorobisphenol A, combinations thereof, and the like.

The epoxy resin monomers or prepolymers may be virtually any of a variety of commercially available materials. The glycidyl ethers of various phenolic compounds are particularly important. These include the glycidyl ethers of bisphenol A.

These resins are widely available from a number of manufacturers such as Shell Chemical Company, DOW Chemical Company, and Vantico in a variety of molecular weights and viscosities. Examples include: D.E.R. 332, D.E.R. 330, D.E.R. 331, D.E.R. 383, D.E.R. 661, TACTIX 123, TACTIX 138, and TACTIX 177 all products of DOW Chemical Company, 2030 Dow Center, Midland, Mich.; EPON 825, EPON 826, and EPON 828 all products of Shell Chemical Company, 910-T Louisiana St., Houston, Tex.; and, ARALDITE GY 6008, ARALDITE GY 6010, and ARALDITE GY2600 all product s of Vantico Inc. Additionally, flame retardant epoxy resins can be used including fluorinated or brominated bisphenol type epoxy resins under the product names D.E.R. 542 and D.E.R. 566-A80 from DOW Chemical Company. Another important class of glycidyl ethers are those of phenolic novolac and cresol novolac resins. These materials are also widely available from a number of manufacturers in a variety of molecular weights and viscosities. Examples include Epon 862 and Epon 155, which are products of the Shell Chemical Company; D.E.R. 354, D.E.N. 431, D.E.N. 438, and D.E.N. 439 which are products of DOW Chemical Company; and ARALDITE PY 306, ARALDITE EPN 1139, ARALDITE EPN 1138, ARALDITE GY 281, ARALDITE GY 285, ARALDITE GY 302-2, ARALDITE LY 9703, ARALDITE XD 4955, and ARALDITE ECN 9511, which are product s of Vantico Inc.

A similar epoxy that may also be used is SU-8, a product of Shell Chemical Corporation. Several other polyfunctional glycidyl ethers are of significant importance for high performance applications, i.e. heavy mechanical loads under conditions of high temperature and harsh environment. The materials include: the tetraglycidyl ether of tetrakis (4-hydroxyphenyl)ethane, which is commercially available from the Shell Chemical Company under the product name EPON 1031 and from Vantico, Inc. under the product name ARALDITE MT 0163. The diglycidyl ether of 9,9-bis(4-hydroxyphenyl) fluorene is commercially available from Shell Chemical Corporation under the Product name EPON HPT 1079. Glycidyl ethers of the condensation product of dicyclopentadiene and phenol are available from DOW Chemical Company under the product name TACTIX 556.

The triglycidyl ether of tris(hydroxyphenyl) methane, which is available from DOW Chemical Company under the product names TACTIX 742 or XD9053. EPON 1031, EPON HPT 1079, TACTIX 556, TACTIX 742 and XD9053, are either high viscosity liquids or solids at room temperature. Therefore it is advantageous to blend these materials with a low viscosity bisphenol A or bisphenol F based diglycidyl ether or reactive diluents. The resulting blends are less viscous at ambient temperatures and are more easily processed. Some heating may be required for adequate flow, but the temperatures needed are not high enough to cause thermal curing of the epoxy group. Specific blends were found to have a good overall combination of low viscosity in the uncured state and high glass transition temperature, flexural strength, and modulus when cured. It is particularly advantageous to blend a high performance semi-solid epoxy such as TACTIX 556, TACTIX 742 or EPON HPT 1079, with a low viscosity bisphenol A or bisphenol F based glycidyl ether epoxy such as EPON 862, TACTIX 123, or a reactive diluent. EPON 862 is a product of Shell Chemical Corporation.

The cyanate esters that can be employed pursuant to the present invention have two or more —O—CN groups and are curable through a cyclotrimerization reaction. The cyanate esters can be monomeric or less preferably polymeric, including oligomers and can be represented by those materials containing the following group:

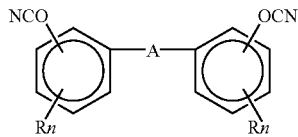

where A represents independently a single bond, —C(CH$_3$)(H)—, —SO$_2$—, —O—, —C(CF$_2$)$_2$—, —CH$_2$OCH$_2$—, —S—, —C(=O)—. —O—C(=O)—O—, —S(=O)—, —O—P(=O)—O—, —O—P(=O)(=O)—O—, divalent alkylene radicals such as —CH$_2$— and —C(CH$_3$)$_2$—, or divalent alkylene radicals interrupted by heteroatoms in the chain such as O, S, and N.

Each R is independently selected from the group of hydrogen, alkyl containing 1 to 9 carbon atoms. Each n independently is an integer of 0 to 4.

Other cyanates useful in the method, composition, and structure of the invention can be prepared by well known methods, for example, by reacting the corresponding polyvalent phenol with a halogenated cyanate, as described in U.S. Pat. Nos. 3,553,244; 3,740,348; and 3,755,402.

The phenol reactant can be any aromatic compound containing one or more reactive hydroxyl groups. The phenolic reactant is preferably a di- or tri-polyhydroxy compound of the formula:

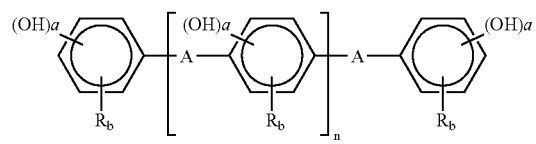

in which each a and b is independently 0, 1, 2, or 3, and at least one a is not 0; n is within the range of 0 to about 8, preferably 0 to 3; each R is independently selected from non-interfering alkyl, aryl, alkaryl, heteroatomic, heterocyclic, carbonyloxy, carboxy, and the like ring substituents, such as hydrogen, C$_{1-6}$ alkyl, C$_{1-6}$ allyl, C$_{1-6}$ alkoxy, halogen, maleimide, propargyl ether, glycidyl ether, and the like; and A is a polyvalent linking moiety which can be, for example, aromatic, aliphatic, cycloaliphatic, polycyclic, and heteroatomic. Examples of linking moiety A include —O—, —SO$_2$—, —CO—, —OCOO—, —S—, —C$_{1-12}$—, dicyclopentadienyl, aralkyl, aryl, cycloaliphatic, and a direct bond.

Specific cyanate esters that can be employed in the present invention are available and well-known and include those discussed in U.S. Pat. Nos. 4,195,132; 3,681,292; 4,740,584; 4,745,215; 4,477,629; and 4,546,131; European patent application EP0147548/82; and German Offen. 2611796, disclosures of which are incorporated herein by reference. A preferred polyfunctional cyanate ester is bisphenol AD disyanate (4.4'-ethylidenebisphenoldicyanate) available from Vantico Inc. under the trade designation AROCY L-10, hexafluoro bisphenol A dicyanate (Arocy-40S), and bisphenol M dicyanate (RTX366) both commercially available from Vantico Inc.

The compositions of this invention utilize a flexibilizer which comprises about 1.0% to about 5% by weight of the composition. The purpose of the flexibilizer is to impart desirable mechanical properties to the cured composition, such as flexibility and thermal shock resistance especially when such compositions can experience temperature excursions below −40° C. Flexibilizing agents including options such as a thermoplastic, hydroxy-containing thermoplastic oligomer, epoxy or other organic functional reactive-containing thermoplastic oligomer, reactive flexibilizer, rubber, elastomer, epoxy functionalized flexibilizers, engineering thermoplastics, and amine or hydroxy-terminated thermoplastic oligomers or mixtures thereof could be used in the present invention to provide cured compositions having high glass transition temperatures, good mechanical properties, and good toughness at low temperatures.

The epoxy resin monomer flexibilizing agents described above may also be advantageously modified by mixing with various additives. Such additives include polyols such as ethylene glycol, propylene glycol, 1,3-butylene glycol, 1,4- butylene glycol, and other glycols. Aromatic diphenols and polyphenolic compounds may also be used to modify the epoxy resin. Other reactive diluents, which contain vinyl, acrylate, or methacrylate may be employed to change reactivity, glass transition temperature, or mechanical properties. In addition, reactive diluents based on monofunctional or polyfunctional glycidyl ethers may also be used to reduce the viscosity or modify the resin systems.

High molecular weight engineering thermoplastics are particularly effective at increasing the flexibility of the thermally or radiatively cured epoxy or epoxy-triazine mixtures utilized as binding matrices. Polysulfones which are available under the product names UDEL and RADEL from BP-Amoco Chemicals, Chicago, Ill., can be dissolved in the epoxy resin composition to form a viscous homogeneous mixture. Similar results can be obtained with a polyetherimide available under the product name ULTEM from General Electric Plastics, Pittsfield, Mass. It is not necessary for the thermoplastic to be miscible with the triazine or triazine epoxy resin composition. The addition of Nylon 12 and Nylon 6/12 particles, under the product names ELF ATOCHEM ORGASOL 2001 and ORGASOL 3501, respectively, both available from Atofina Chemicals, Inc., Philadelphia, Pa., can result in improved fracture toughness even though these materials are insoluble in the epoxy resin monomer mixture. Similar results may also be obtained using insoluble polyimide particles, available under the product name IMITEC X-902 from Imitec Inc., 1990 Maxon Road, Schenectady, N.Y. Other thermoplastics such as polyamideimides, poly(arylene ethers), polyesters, polyarylates, polycarbonates, polyurethanes, and others are potentially useful as flexibilizers in the present invention, examples of which can be found in "Engineering Plastics, "D. C. Clagett, Encyclopedia of Polymer Science and Engineering", John Wiley and Sons, final edition.

Engineering thermoplastics are typically endcapped with nonreactive functional groups. It may also be advantageous for the flexibilizing agent to be a low molecular weight segment or oligomer of a previously described engineering thermoplastic, which contains functional groups that are capable of reaction with the cyanate or epoxy-cyanate resin during thermally induced polymerization. Accordingly, thermoplastic materials that have been modified to contain a thermoplastic oligomer backbone and to have more reactive end groups are particularly useful as flexibilizers. For this purpose hydroxy-terminated polysulfone oligomers based on the UDEL P-1700 polymer backbone can be synthesized at various molecular weights. UDEL P-1700 is one of the UDEL products previously described. These materials can be more easily blended with the resin monomer mixture and the resulting compositions are less viscous than those having the same percentage of high molecular weight polymer of similar backbone, but with different end groups. These materials are also found to be very effective in increasing fracture toughness. Oligomers with other backbones can also be used, particularly those of poly(arylene ethers), polyarylates, and polyesters. Conceivably, the oligomer backbone could be that of any of the previously referenced thermoplastics. Reactive end groups are those which react with the cyanate-epoxy resin during thermal polymerization. These groups include hydroxy, epoxy, and carboxylate groups. Flexible molecules which contain two or more epoxy groups represent a class of material which can also useful as flexibilizers for the present invention. These compounds typically contain long aliphatic groups which act to reduce crosslink density in the cured epoxy resin. In addition to increasing the fracture toughness of the cured resin, the addition of low viscosity flexibilizers can also significantly reduce the overall viscosity of the uncured resin/flexibilizer mixture. Useful flexibilizers include but are not limited to: 1,4-butane-diol diglycidyl ethers (product name SHELL HELOXY MODIFIER 67), neopentlyglycol diglycidyl ether (product name SHELL HELOXY MODIFIER 68), cyclohexane dimethanol diglycidyl ether (product name SHELL HELOXY MODIFIER 107), trimethylol ethane triglycidyl ethers (product name SHELL HELOXY MODIFIER 44), dibromoneopentylglycol glycidyl ethers (product name SHELL HELOXY MODIFIER 56), propoxylated glycerol polyglycidyl ether (product name SHELL HELOXY MODIFIER 84), polypropylene glycol glycidyl ether (product name SHELL HELOXY MODIFIER 32), polyglycidyl ether of castor oil (product name SHELL HELOXY MODIFIER 505), diner acid diglycidyl esters (product name SHELL HELOXY MODIFIER 71), resorcinol diglycidyl ether (product name SHELL HELOXY MODIFIER 69). These HELOXY MODIFIERS are available from Shell Chemical Company. Other examples of useful flexibiliziers include epoxidized propylene glycol dioleates (product name ELF ATOCHEM VIKOFLEX 5075), epoxy esters (product name ELF ATOCHEM VIKOFLEX 4050), 1,2-tetradecane oxides (product name ELF ATOCHEM VIKOFLEX 14), internally epoxidized 1,3-butadiene homopolymers (product name ELF ATOCHEM POLY BD 600 and POLY BD 605). These ATOCHEM flexibilizers are available from Atofina Chemicals Inc. Further examples of flexibilizers useful in this invention are diglycidyl ether, glycidyl glycidate, bis(2,3-epoxy-2-methylpropyl)ether, and polyglycoldiepoxides, available under the product names DER 732 and DER 736 from DOW Chemical Company. Flexible molecules which contain two or more hydroxy groups are also useful as flexibilizers for this invention. These flexible polyol compounds also contain long aliphatic groups. Useful polyols include E-caprolacetone triol available under the product names TONE 0301, 0305, 0310 from Union Carbide Corp, Danbury, Conn.

Elastomers or rubbers may also be used as flexibilizers. Examples of these materials include, but are not limited to, the copolymers of styrene, butadiene, and ethylene or styrene, butylene, and ethylene, butadiene, styrene copolymers, copolymers of butadiene and styrene, butyl rubber, neoprene rubber, and poly (siloxanes). Functionalized versions of these materials such as carboxyl terminated poly (n-butylacrylate) rubber are particularly useful. Epoxy resin monomers may be reacted with these materials to form an epoxy terminated elastomer which is useful as a flexibilizer. Maleic anhydride terminated KRATON rubber, available under the product name FG 1901X from Shell Chemical Corporation, and epoxy functionalized liquid KRATON rubbers, available under product names EXP-206 and EXP-207 also from Shell Chemical Corp., are especially useful as flexibilizers. Other products also include prereacted epoxy resins with butadiene-acrylate copolymers, available as the MRU-283 product series from 3M Corp, St. Paul, Minn.

It may also advantageous to blend the various types of flexibilizers in order to adjust the overall viscosity of the uncured resin/flexibilizer composition. A flexibilizer may be added to a mixture of a thermoplastic or thermoplastic oligomer dissolved in an epoxy resin monomer. Overall viscosity may be reduced and toughness may be improved compared with using a flexibilizer alone. The thermoplastic may separate from the cured epoxy-cyanate resin to form a two phase morphology while the flexibilizer provides long flexible groups to connect crosslink sites in the network.

The molecular weight of the flexibilizers can range between about 400 and about 20,000, more preferably between 500 and 5000. Fluoridized rubbers or polysiloxanes that are provided with a terminally functional group and hydroxylated or carboxylated EPDM (ethylene propylene/ ethylidene norbornene rubbers can also be used as flexibilizers in the present invention.

The compositions employed pursuant to the present invention also include a filler comprising from about 45 percent to about 75 percent by weight of the composition. Thermally conductive and electrically insulating fillers can be used for improving the thermal heat transfer from the semiconductor chip to the surroundings. Such fillers include Aluminum Oxide, 92% Alumina, 96% Alumina, Aluminum Nitride, Silicon Nitride, Silicon Carbide, Beryllium Oxide, Boron Nitride and Diamond powder either high pressure or Plasma CVD. The filler material can also be a zirconate such as zirconium tungstate having a negative coefficient of thermal expansion property. These fillers can be used in concentrations equivalent to fused silica and by blending these into suitable low viscosity thermosetting resins thermally conductive C4 encapsulating media could be realized. Fused silica is well known in the art and will not be described here. The filler particles can have substantially spherical or spheroidal shapes and have diameters of less than about 41 microns, preferably about 0.7 to about 31 microns. This is necessary so that the composition will readily flow in the gap between the chip and substrate carrier. The gap is normally about 25 to about 160 microns.

A portion of each of the filler particles can include a layer of a coupling agent positioned thereon to improve adhesion and moisture resistance. Coupling agents, such as c-aminopropyltriethoxy silane, available under the product name A1100, b-(3,4-epoxycyclohexyl) ethyltrimethoxy silane, available under the product name A186, or c-glycidylpropyltrimethoxy silane, available under the product name Z6040 all from Dow Chemical Company can be used in this invention. An amount of coupling agent which is about 0.25% by weight of filler has been found to be satisfactory. The amount can be determined by weight loss of filler treated with coupler after burning. The thickness of the coupling agent should be more than about a few monolayers.

In addition to the binder and filler, the compositions can also include a catalyst to promote the polymerization of the epoxy and/or cyanate ester.

Suitable catalysts for the epoxy include amines such as the imidazoles, tertiary amine benzyldimethylamine, 1,3-tetramethyl butane diamine, tris(dimethylaminomethyl) phenol, pyridine, and triethylenediamine, and acidic catalysts, such as stannous octoate.

Suitable catalysts for the cyanate ester include Lewis acids, such as aluminum chloride, boron trifluoride, ferric chloride, titanium chloride, and zinc chloride; salts of weak acids, such as sodium acetate, sodium cyanide, sodium cyanate, potassium thiocyanate, sodium bicarbonate, and sodium boronate. Preferred catalysts are metal carboxylates and metal chelates, such as cobalt, manganese, iron, zinc, and copper acetylacetonate or octoates and naphthenates. The amount of catalyst, when used, can vary, and generally will be about 0.005 to about 5 weight percent, preferably about 0.05 to about 0.5 weight percent based on total solid binder (resin weight excluding the filler content) weight.

Surfactants in amounts of about 0.5% to about 3% by weight of the composition and preferably about 1.2% to about 11.6% by weight of the composition can be used to facilitate mixing the filler with the epoxy. Suitable surfactants include silanes and non-ionic type surface active agents, available as polyethylene glycol-p-tert-octylphenyl ether under the product name Triton X-100 from Rohm and Hass Co., Philadelphia, Pa. Surfactants are generally prepared by the reaction of octylphenol or nonylphenol with ethylene oxide.

The compositions of the present invention may also include an organic dye in amounts less than about 0.2% by weight of the total composition to provide contrast. Suitable dyes are nigrosine and Orasol blue GN which is a tradename of Ciba Specialty Chemicals, Pigments Division, 205-T S. James St., Newport, Del. The preferred compositions employed pursuant to the present invention are substantially free (e.g. less than 0.2% by weight) if not completely free from non-reactive organic solvents. Compositions employed pursuant to the present invention have viscosity at about 25° C. (Brookfield cone & plate Spindle 51, 20 RPM or equivalent) of about 750 cps to about 50,000 cps and preferably about 3,000 cps to about 20,000 cps. The as mixed compositions are stable for at least about 12 hours and can be subsequently cured at temperatures of less than about 200° C., and preferably about 130° C. to about 180° C., in about 2 to about 6 hours and preferably about 4 to about 5 hours. The cured compositions have coefficients of thermal expansion of about 25 to about 40 ppm/° C., glass transition temperatures of greater than about 130° C., and preferably about 140° to about 190° C. The cured compositions have Shore D hardness of greater than about 85 and preferably greater than about 90.

In accordance with the teachings of this invention, there is also provided an electronic package 10 which includes a substrate 2 having an upper surface 4, a semiconductor chip 6 mounted on a portion of the upper surface of the substrate and electrically coupled to the substrate, the semiconductor chip having a bottom surface 8 and at least one edge surface 12 being substantially perpendicular to the bottom surface, and a material 14 positioned on at least the portion of the upper surface of the substrate and against at least a portion of the at least one edge surface of the semiconductor chip, the material having an encapsulant composition, as described in detail above, which includes a resin material, a flexiblizing agent and a filler material.

The substrate of the package can include an organic material, either rigid or flexible, including conventional FR-4 epoxy and laminates based on high temperature resins, such as high temperature epoxies, polyimides, cyanates (triazines), fluoropolymers, benzocyclobutenes, polyphenylenesulfide, polysulfones, polyetherimides, polyetherketones, polyphenylquinoxalines, polybenzoxazoles, polyphenyl benzobisthiazoles and dicyclopentadiene based epoxies, cyanates or other functionalities. The substrate can also include halide free resins. The substrate of the package can include a reinforcing material selected from the group consisting of organic woven fibers, organic non-woven fibers, inorganic fibers, and inorganic non-woven fibers.

Fluoropolymers include perfluoroalkylenes, as polytetrafluorethylene, copolymers of tetrafluoroethylene and hexaf luoropropylene, copolymers of tetrafluoroethylene and perfluoro-2,2-dimethyl-1,3-dioxide, polytrifluorochloroethylene, copolymers of tetrafluoroethylene with olefins as ethylene, copolymers of trifluorochloromethane with olefins as ethylene, and polymers of perfluoroalkyl vinyl ether. Some commercially available fluoropolymers include polytetrafluoroethylene, tetrafluoroethylenne-perfluoroalkoxy, tetrafluoroethylene-ethylene, chlorotrifluoroethylene-ethylene, chlorotrifluoroethylene, and tetrafluoroethylene-perfluoro-2,2-dimethyl-1,3 dioxide.

Commercially available fluorocarbon polymers reinforced with fiber glass particulates useful in this invention are available from the Rogers Corporation, Rogers, Conn. under the trade designations RO2800 and RO2500.

The polymers that can be used as substrates in accordance with the present invention may also include unmodified polyimides, as well as modified polymides such as polyester imides, polyamide-imide-esters, polyamide-imides, polysiloxane-imides as well as other mixed polyimides. Such are well known in the prior art and need not be described in greater detail.

The substrate can also comprise an inorganic, or composite organic/inorganic material. Substrates having thin film redistribution layers may also be used. Inorganic substrates that can be used in this invention comprise ceramic material. The preferred ceramic substrates include silicon oxides and silicates, such as aluminum silicate and aluminum oxides and can include a layer of glass material therein. High heat transfer substrates, such as aluminum nitride substrates, may also be used.

In accordance with yet another embodiment of this invention, a method for making the encapsulant composition defined above is hereby provided. The method comprises the steps of providing a first quantity of resin material as defined hereinabove, adding to the first quantity of resin material a second quantity of the above-defined flexibilizing agent, adding to the first quantity of resin material a third quantity of filler material of the type defined above, and then blending the resin material under vacuum. Vacuum is used at a pressure of about 5 millimeters of mercury. The method can include homogenizing the flexibilizing agent in the first quantity of resin material by reacting the resin material and the flexibilizing agent together at a temperature of greater than about 100 degrees ° C.

The encapsulant composition can be applied to the gap between a semiconductor chip assembled to a substrate by C4 interconnections by dispensing the encapsulant composition through nozzles under pressure of about 15 pounds per square inch to about 90 pounds per square inch and temperatures of about 25 degrees ° C. to about 45 degrees ° C. The encapsulant composition can completely cover the C4 interconnections, the surface of the substrate on which the semiconductor is assembled, and at least a portion of the edges of the device forming a fillet as illustrated in the drawing. It may be desirable to pregell the encapsulant composition by heating for about 15 to about 60 minutes, typically about 30 minutes at about 75° C. to about 100° C. and cure the encapsulant after application.

The encapsulant composition can then be substantially cured by heating to about 130° C. to about 200° C. and preferably about 130° C. to about 180° C. for about 2 hours to about 6 hours and preferably about 2 to about 4 hours.

While there have been shown and described what are presently considered the preferred embodiments of the invention, it will be obvious to those skilled in the art that various changes and modifications may be made therein without departing from the scope of the invention as defined by the appended claims.

I claim:

1. An encapsulant composition comprising:
a resin material selected from the group consisting of epoxy and cyanate ester resins;
from about 1.0% by weight to about 5% by weight of the composition of a flexibilizing agent comprising a flexibilizer containing functional groups capable of reaction with the epoxy or cyanate ester resin during thermally induced curing, and a thermoplastic other than the flexibilizer, wherein the thermoplastic is separated from the cured epoxy or cyanate ester resin; and
a filler material comprising substantially spherical or spheroidal particles, each particle having a diameter of less than about 41 microns,
wherein the composition has a higher fracture toughness, a lower viscosity, and increased thermal shock resistance at a temperature excursion below −40° C., or combinations thereof than the composition would have if the flexibilizing agent were not present in the composition,
wherein the thermoplastic comprises a poly(arylene)ether, and
wherein the flexibilizer comprises bis(2,3-epoxy-2-methylpropyl)ether.

2. The composition of claim 1, wherein a portion of each of said spherical or spheroidal particles includes a layer of coupling agent positioned thereon, and wherein the coupling agent comprises about 0.25% by weight of the filler material.

3. An electronic package comprising:
a substrate having an upper surface;
a semiconductor chip mounted on a portion of said upper surface of said substrate and electrically coupled to said substrate, said semiconductor chip having a bottom surface and at least one edge surface being substantially perpendicular to said bottom surface; and
a material positioned on at least said portion of said upper surface of said substrate and against at least a portion of said at least one edge surface of said semiconductor chip, said material being the encapsulant composition of claim 1.

4. A method of making an encapsulant composition, the method comprising the steps of:
providing a first quantity of resin material selected from the group consisting of epoxy and cyanate ester resins;
adding to said first quantity of resin material a second quantity of flexibilizing agent by homogenizing said flexibilizing agent in said first quantity of resin material by reacting said resin material and said flexibilizing agent together at a temperature of greater than about 100 degrees Celsius, from about 1.0% by weight to about 5% by weight of the composition of said flexibilizing agent comprising a flexibilizer containing functional groups capable of reaction with the epoxy or cyanate ester resin during thermally induced curing, and a thermoplastic other than the flexibilizer, wherein the thermoplastic is separated from the cured epoxy or cyanate ester resin;
adding to said first quantity of resin material a third quantity of filler material comprising substantially spherical or spheroidal particles, each particle having a diameter of less than about 41 microns; and
blending said resin material, wherein after said blending said flexibilizing agent comprises 1 percent to about 5 percent by weight of said composition,
wherein immediately after the steps of adding the flexibilizing agent and adding the filler material have been performed the composition is uncured and the composition is stable for a time period at least 12 hours,
wherein the composition has a higher fracture toughness, a lower viscosity, and increased thermal shock resistance at a temperature excursion below −40° C., or combinations thereof than the composition would have if the flexibilizing agent were not present in the composition, wherein the thermoplastic comprises a poly(arvlene) ether, and wherein the flexibilizer comprises bis(2,3-epoxv-2-methylpropyl)ether.

5. The method of claim 4, wherein said step of blending is performed under vacuum.

6. The method of claim 5, wherein said step of blending is performed under vacuum at a pressure of about 5 millimeters of mercury.

7. The method of claim 4, wherein a portion of each of said spherical or spheroidal particles includes a layer of coupling agent positioned thereon, and wherein the coupling agent comprises about 0.25% by weight of the filler material.

8. The composition of claim 1, wherein the resin material consists of epoxy resins, wherein the composition further comprises a surfactant comprising that facilitates mixing the filler with the epoxy resins, wherein the surfactant comprises non-ionic type surface active agents, and wherein the surfactant comprises between about 0.5% and about 3% by weight of the composition.

9. The composition of claim 1, wherein the filler material has a negative coefficient of thermal expansion.

10. The composition of claim 1, wherein the composition further comprises an organic dye comprising less than about 0.2% by weight of the composition.

11. The composition of claim 1, wherein the composition further comprises non-reactive organic solvents comprising less than about 0.2% by weight of the composition.

12. The composition of claim 1, wherein the composition is cured and has a coefficient of thermal expansion between about 25 and about 40 ppm/° C., a glass transition temperature between about 140° and about 190° C., and a Shore D hardness greater than about 90.

13. The method of claim 4, wherein the resin material consists of epoxy resins, wherein the composition further comprises a surfactant comprising that facilitates mixing the filler with the epoxy resins, wherein the surfactant comprises non-ionic type surface active agents, and wherein the surfactant comprises between about 0.5% and about 3% by weight of the composition.

14. The method of claim 4, wherein the filler material has a negative coefficient of thermal expansion.

15. The method of claim 4, wherein the composition further comprises an organic dye comprising less than about 0.2% by weight of the composition.

16. The method of claim 4, wherein the composition further comprises non-reactive organic solvents comprising less than about 0.2% by weight of the composition.

17. The method of claim 4, wherein after the substantially curing step, the composition has a coefficient of thermal expansion between about 25 and about 40 ppm/° C., a glass transition temperature between about 140° and about 190° C., and a Shore D hardness greater than about 90.

18. The composition of claim 1, wherein the resin material consists of epoxy resins, and wherein the epoxy resins comprise 3',4'-epoxycyclohexylmethyl 3,4-epoxycyclohexanecarboxylate.

19. The composition of claim 1, wherein the filler material comprises zirconium tungstate.

20. The composition of claim 2, wherein the coupling agent comprises b-(3,4-epoxycyclohexyl)ethyltrimethoxy silane.

21. The composition of claim 8, wherein the surfactant comprises polyethylene glycol-p-tert-octylphenyl ether.

22. The composition of claim 10, wherein the organic dye comprises nigrosine.

23. The method of claim 4, wherein the resin material consists of epoxy resins, and wherein the epoxy resins comprise 3',4'-epoxycyclohexylmethyl 3,4-epoxycyclohexanecarboxylate.

24. The method of claim 4, wherein the filler material comprises zirconium tungstate.

25. The method of claim 7, wherein the coupling agent comprises b-(3,4-epoxycyclohexyl)ethyltrimethoxy silane.

26. The method of claim 13, wherein the surfactant comprises polyethylene glycol-p-tert-octylphenyl ether.

27. The method of claim 15, wherein the organic dye comprises nigrosine.

* * * * *